US011120243B2

(12) United States Patent
Liu et al.

(10) Patent No.: US 11,120,243 B2
(45) Date of Patent: Sep. 14, 2021

(54) FINGERPRINT IDENTIFICATION MODULE, MANUFACTURING METHOD AND DRIVING METHOD THEREOF, DISPLAY DEVICE

(71) Applicant: BOE TECHNOLOGY GROUP CO., LTD., Beijing (CN)

(72) Inventors: Yingming Liu, Beijing (CN); Haisheng Wang, Beijing (CN); Xiaoliang Ding, Beijing (CN); Pengpeng Wang, Beijing (CN); Xiufeng Li, Beijing (CN); Chenyang Zhang, Beijing (CN); Peixiao Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 91 days.

(21) Appl. No.: 16/575,716

(22) Filed: Sep. 19, 2019

(65) Prior Publication Data

US 2020/0242316 A1    Jul. 30, 2020

(30) Foreign Application Priority Data

Jan. 28, 2019   (CN) .......................... 201910081953.8

(51) Int. Cl.
*G06K 9/00* (2006.01)
*H01L 41/18* (2006.01)
*G06F 3/01* (2006.01)

(52) U.S. Cl.
CPC .......... *G06K 9/0002* (2013.01); *G06F 3/017* (2013.01); *H01L 41/18* (2013.01)

(58) Field of Classification Search
CPC ..... G06K 9/0002; H01L 41/18; H01L 41/193; G06F 3/017
See application file for complete search history.

(56) References Cited

U.S. PATENT DOCUMENTS

2010/0007616 A1* 1/2010 Jang .................. H01L 27/323
345/173
2010/0173553 A1* 7/2010 Tanaka ................. B82Y 10/00
445/24

(Continued)

FOREIGN PATENT DOCUMENTS

CN    107194345 A    9/2017
CN    107194384 A    9/2017

(Continued)

OTHER PUBLICATIONS

First Chinese Office Action Application No. 201910081953.8; dated Sep. 1, 2020.
First Search Application No. 2019100819538.

*Primary Examiner* — Premal R Patel

(57) ABSTRACT

A fingerprint identification module, a manufacturing method thereof, a driving method thereof, and a display device are disclosed. The fingerprint identification module includes: a plurality of ultrasonic wave receiving sensors, configured to receive an ultrasonic wave; and at least one ultrasonic wave emission sensor, configured to emit an ultrasonic wave, each of the plurality of ultrasonic wave receiving sensors includes a first piezoelectric material layer, each of the at least one ultrasonic wave emission sensor includes a second piezoelectric material layer, and a material of the first piezoelectric material layer is different from a material of the second piezoelectric material layer.

14 Claims, 8 Drawing Sheets

(56) References Cited

U.S. PATENT DOCUMENTS

| | | | |
|---|---|---|---|
| 2013/0020279 A1* | 1/2013 | Lee | B81C 1/00476 216/13 |
| 2014/0292941 A1* | 10/2014 | Kobayashi | B41J 2/1634 347/68 |
| 2014/0352440 A1* | 12/2014 | Fennell | G01N 29/22 73/632 |
| 2016/0107194 A1* | 4/2016 | Panchawagh | G01S 7/5208 367/140 |
| 2016/0225907 A1* | 8/2016 | Kim | H01L 27/3276 |
| 2017/0194934 A1* | 7/2017 | Shelton | H03H 9/02244 |
| 2018/0148318 A1* | 5/2018 | Flynn | B81C 1/0069 |
| 2018/0226564 A1* | 8/2018 | Itayama | G01H 7/00 |
| 2018/0276440 A1* | 9/2018 | Strohmann | G06K 9/0008 |
| 2018/0317950 A1* | 11/2018 | Sinelnikov | G01N 29/221 |
| 2018/0329238 A1 | 11/2018 | Koyama et al. | |
| 2019/0102045 A1* | 4/2019 | Miranto | G01S 15/8913 |
| 2019/0184426 A1* | 6/2019 | Kojima | H01L 41/332 |
| 2019/0290242 A1* | 9/2019 | Suzuki | B06B 1/0607 |
| 2020/0133414 A1* | 4/2020 | Lee | G06F 3/0443 |

FOREIGN PATENT DOCUMENTS

| | | |
|---|---|---|
| CN | 108431681 A | 8/2018 |
| CN | 108537179 A | 9/2018 |

\* cited by examiner

100

100

FINGERPRINT IDENTIFICATION MODULE, MANUFACTURING METHOD AND DRIVING METHOD THEREOF, DISPLAY DEVICE

The application claims priority to the Chinese patent application No. 201910081953.8 filed on Jan. 28, 2019, the entire disclosure of which is incorporated herein by reference as part of the present application.

TECHNICAL FIELD

Embodiments of the present disclosure relate to a fingerprint identification module, a manufacturing method of the fingerprint identification module, a driving method of the fingerprint identification module, and a display device.

BACKGROUND

With continuous development of science and technology, a fingerprint identification technology has gradually been applied to people's daily lives. The fingerprint identification technology can identify by comparing detail feature points of different fingerprints, so as to achieve a function of identification. Generally, the fingerprint identification technology can be divided into an optical fingerprint identification technology, a silicon chip fingerprint identification technology and an ultrasonic wave fingerprint identification technology.

At present, the ultrasonic wave fingerprint identification technology is a hot research direction of major manufacturers. An ultrasonic wave fingerprint identification structure is mainly a three-layer structure including a driving electrode, a receiving electrode and a piezoelectric layer located there between. Upon a driving voltage being applied to the driving electrode and the receiving electrode, the piezoelectric layer is subjected to a voltage excitation to generate an inverse piezoelectric effect, and the piezoelectric layer transmits a first ultrasonic wave outward. After the first ultrasonic wave contacts a finger, a second ultrasonic wave is reflected back by the finger. Because the fingerprint includes valleys and ridges, a vibration intensity of the second ultrasonic wave reflected by the fingerprint back to the piezoelectric layer is different. In this case, upon a fixed voltage being applied to the driving electrode, the piezoelectric layer can convert the second ultrasonic wave into a voltage signal. The voltage signal is transmitted to a fingerprint identification module through the receiving electrode, and positions of the valleys and the ridges in the fingerprint are determined according to the voltage signal.

SUMMARY

Embodiments of the present disclosure provide a fingerprint identification module, a manufacturing method of the fingerprint identification module, a driving method of the fingerprint identification module and a display device. A fingerprint identification module includes: a plurality of ultrasonic wave receiving sensors, configured to receive an ultrasonic wave; and at least one ultrasonic wave transmitting sensor, configured to transmit an ultrasonic wave, each of the plurality of ultrasonic wave receiving sensors includes a first piezoelectric material layer, each of the at least one ultrasonic wave transmitting sensor includes a second piezoelectric material layer, and a material of the first piezoelectric material layer is different from a material of the second piezoelectric material layer.

At least one embodiment of the present disclosure provides a fingerprint identification module. The fingerprint identification module includes: a plurality of ultrasonic wave receiving sensors, configured to receive an ultrasonic wave; and at least one ultrasonic wave transmitting sensor, configured to transmit an ultrasonic wave, each of the plurality of ultrasonic wave receiving sensors includes a first piezoelectric material layer, each of the at least one ultrasonic wave transmitting sensor includes a second piezoelectric material layer, and a material of the first piezoelectric material layer is different from a material of the second piezoelectric material layer.

For example, in the fingerprint identification module provided by an embodiment of the present disclosure, the second piezoelectric material layer has a piezoelectric strain constant greater than that of the first piezoelectric material layer.

For example, in the fingerprint identification module provided by an embodiment of the present disclosure, the first piezoelectric material layer has a piezoelectric voltage constant greater than that of the second piezoelectric material layer.

For example, in the fingerprint identification module provided by an embodiment of the present disclosure, a material of the first piezoelectric material layer includes a polyvinylidene fluoride, and a material of the second piezoelectric material layer includes an aluminum nitride or a lead zirconate titanate piezoelectric ceramic.

For example, in the fingerprint identification module provided by an embodiment of the present disclosure, the each of the plurality of ultrasonic wave receiving sensors further includes a first receiving electrode and a second receiving electrode, the first receiving electrode is located on a side of the first piezoelectric material layer, the second receiving electrode is located on a side of the first piezoelectric material layer away from the first receiving electrode, and each of the at least one ultrasonic wave transmitting sensor further includes a first transmitting electrode and a second transmitting electrode, the first transmitting electrode is located on a side of the second piezoelectric material layer, the second transmitting electrode is located on a side of the second piezoelectric material layer away from the first transmitting electrode.

For example, the fingerprint identification module provided by an embodiment of the present disclosure, further includes: a base substrate, located on a side of the first receiving electrode away from the first piezoelectric material layer, and including a contact surface configured to be contacted by a fingerprint, the first transmitting electrode is located on a side of the second receiving electrode away from the base substrate.

For example, the fingerprint identification module provided by an embodiment of the present disclosure, further includes: a first contact electrode; and a second contact electrode, the first contact electrode and the second contact electrode are provided in a same layer with the second receiving electrode, each of the at least one ultrasonic wave transmitting sensor further includes a via hole and a connection electrode that are located in the second piezoelectric material layer, the first contact electrode is directly in contact with the first transmitting electrode, the connection electrode passes through the via hole to electrically connect the second transmitting electrode and the second contact electrode.

For example, in the fingerprint identification module provided by an embodiment of the present disclosure, the first transmitting electrode and the first receiving electrode are provided in a same layer, the second transmitting electrode and the second receiving electrode are provided in a same layer.

For example, in the fingerprint identification module provided by an embodiment of the present disclosure, each of the at least one ultrasonic wave transmitting sensor further includes: a cavity, located on a side of the second transmitting electrode away from the second piezoelectric material layer.

For example, in the fingerprint identification module provided by an embodiment of the present disclosure, a thickness of the second receiving electrode is less than 10 microns.

For example, in the fingerprint identification module provided by an embodiment of the present disclosure, the at least one ultrasonic wave transmitting includes the plurality of the ultrasonic wave transmitting sensors, and an orthographic projection of the each of the ultrasonic wave transmitting sensors on the base substrate is located between orthographic projections of two adjacent ultrasonic wave receiving sensors on the base substrate.

At least one embodiment of the present disclosure provides a display device. The display device includes the fingerprint identification module of any one of embodiments described above.

For example, the display device provided by an embodiment of the present disclosure further includes: a display module, an area of the display module is substantially the same as an area of the fingerprint identification module.

At least one embodiment of the present disclosure provides a manufacturing method of a fingerprint identification module. The manufacturing method of the fingerprint identification module includes: providing a base substrate; forming a plurality of ultrasonic wave receiving sensors on a side of the base substrate; and forming at least one ultrasonic wave transmitting sensor on a side of the base substrate where the plurality of the ultrasonic wave receiving sensors are formed, each of the plurality of ultrasonic wave receiving sensors includes a first piezoelectric material layer, each of the at least one ultrasonic wave transmitting sensors includes a second piezoelectric material layer, and a material of the first piezoelectric material layer is different from a material of the second piezoelectric material layer.

For example, in the manufacturing method of the fingerprint identification module provided by an embodiment of the present disclosure, the second piezoelectric material layer has a piezoelectric strain constant greater than that of the first piezoelectric material layer.

For example, in the manufacturing method of the fingerprint identification module provided by an embodiment of the present disclosure, forming the at least one ultrasonic wave transmitting sensor on a side of the base substrate where the plurality of the ultrasonic wave receiving sensors are formed includes: providing the at least one ultrasonic wave transmitting sensor; and transferring the at least one ultrasonic wave transmitting sensor on the side of the ultrasonic wave receiving sensors away from the base substrate by a transfer process.

For example, in the manufacturing method of the fingerprint identification module provided by an embodiment of the present disclosure, forming the plurality of ultrasonic wave receiving sensors on the side of the base substrate includes: forming a plurality of first receiving electrodes on the side of the base substrate; forming a first piezoelectric material layer on a side of the plurality of the first receiving electrodes away from the base substrate; and forming a plurality of second receiving electrodes in one-to-one correspondence with the plurality of the first receiving electrodes on a side of the first piezoelectric material layer, the plurality of the first receiving electrodes and the plurality of the second receiving electrodes that are in one-to-one correspondence and the first piezoelectric material layer constitute the plurality of the ultrasonic wave receiving sensors.

For example, the manufacturing method of the fingerprint identification module provided by an embodiment of the present disclosure further includes: forming a first contact electrode and a second contact electrode which are provided in a same layer with the plurality of the second receiving electrodes while forming the plurality of the second receiving electrodes.

For example, in the manufacturing method of the fingerprint identification module provided by an embodiment of the present disclosure, each of the at least one ultrasonic wave transmitting sensor includes a first transmitting electrode, a second piezoelectric material layer, a second transmitting electrode, and a via hole and a connection electrode that are located in the second piezoelectric material layer, transferring the at least one ultrasonic wave transmitting sensor on the side of the ultrasonic wave receiving sensors away from the base substrate by a transfer process includes: connecting the first transmitting electrode and the first contact electrode; and connecting the connection electrode and the second contact electrode, the connection electrode passes through the via hole to electrically connect the second transmitting electrode and the second contact electrode.

At least one embodiment of the present disclosure provides a driving method of a fingerprint identification module. The driving method of the fingerprint identification module includes: driving the at least one ultrasonic wave transmitting sensor to transmit an ultrasonic wave; and driving the plurality of ultrasonic wave receiving sensors to receive an ultrasonic wave reflected by a fingerprint.

For example, in the driving method of the fingerprint identification module provided by an embodiment of the present disclosure, the at least one ultrasonic wave transmitting sensor includes a first ultrasonic wave transmitting sensor and a second ultrasonic wave transmitting sensor, the driving method includes: driving the first ultrasonic wave transmitting sensor to transmit an ultrasonic wave at a first time point; and driving the second ultrasonic wave transmitting sensor to transmit an ultrasonic wave at a second time point, so that a phase of the ultrasonic wave transmitted by the second ultrasonic wave transmitting sensor is delayed with respect to a phase of the ultrasonic wave transmitted by the first ultrasonic wave transmitting sensor, the second time point is later than the first time point.

For example, in the driving method of the fingerprint identification module provided by an embodiment of the present disclosure, the at least one of the ultrasonic wave transmitting sensors includes a third ultrasonic wave transmitting sensor, the second ultrasonic wave transmitting sensor is located between the first ultrasonic wave transmitting sensor and the third ultrasonic wave transmitting sensor, the driving method includes: driving the first ultrasonic wave transmitting sensor and the third ultrasonic wave transmitting sensor to transmit an ultrasonic wave at the first time point; and driving the second ultrasonic wave transmitting sensor to transmit an ultrasonic wave at a second time point, so that a phase of the ultrasonic wave transmitted by the second ultrasonic wave transmitting sensor is delayed with respect to a phase of the ultrasonic wave transmitted by the first ultrasonic wave transmitting sensor and the third ultrasonic wave transmitting sensor, the second time point is later than the first time point.

At least one embodiment of the present disclosure provides a fingerprint identification module. The fingerprint identification module includes: a substrate including a contact surface configured to be contacted by a fingerprint; a plurality of ultrasonic wave devices disposed in an array and disposed on a side of the substrate away from the contact surface. The plurality of ultrasonic wave devices includes a third piezoelectric material layer. A material of the third piezoelectric material layer includes an aluminum nitride or a lead zirconate titanate piezoelectric ceramic.

At least one embodiment of the present disclosure provides a driving method of a fingerprint identification module, the fingerprint identification module is the fingerprint identification module described above. The driving method includes: driving a part of the ultrasonic wave devices to transmit an ultrasonic wave; and driving at least part of the ultrasonic wave devices to receive an ultrasonic wave reflected by a fingerprint.

For example, in the driving method of the fingerprint identification module provided by an embodiment of the present disclosure, the ultrasonic wave devices includes a first ultrasonic wave device and a second ultrasonic wave device, driving a part of the ultrasonic wave devices to transmit an ultrasonic wave includes: driving the first ultrasonic wave device to transmit an ultrasonic wave at a first time point; and driving the second ultrasonic wave device to transmit an ultrasonic wave at a second time point, so that a phase of the ultrasonic wave transmitted by the second ultrasonic wave device is delayed with respect to a phase of the ultrasonic wave transmitted by the first ultrasonic wave device, the second time point is later than the first time point.

BRIEF DESCRIPTION OF THE DRAWINGS

In order to clearly illustrate the technical solutions of the embodiments of the present disclosure, the drawings of the embodiments will be briefly described in the following. Apparently, the described embodiments just relate to a part of the embodiments of the present disclosure without limiting the present disclosure thereto.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

Figure 1:
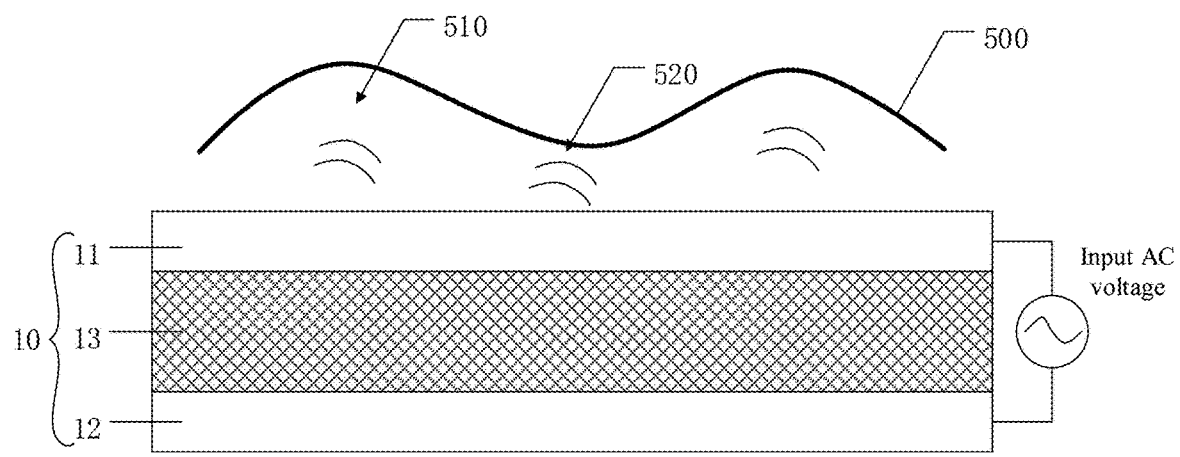
FIG. 1 is a schematic diagram of a fingerprint identification module transmitting an ultrasonic wave.
Figure 2:
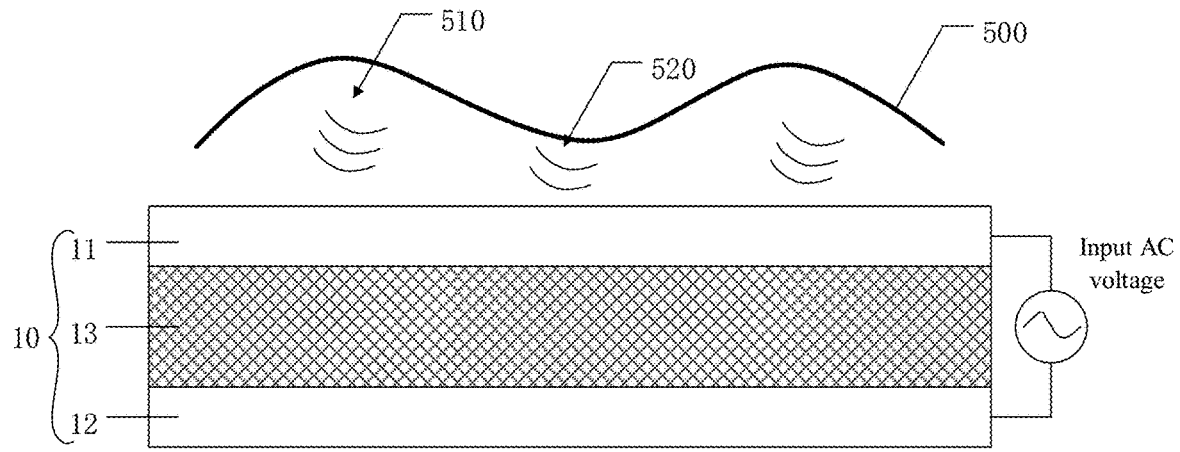
FIG. 2 is a schematic diagram of a fingerprint identification module receiving an ultrasonic wave.

FIG. 1 is a schematic diagram of a fingerprint identification module transmitting an ultrasonic wave. FIG. 2 is a schematic diagram of a fingerprint identification module receiving an ultrasonic wave.

As illustrated by FIG. 1, the fingerprint identification module includes an ultrasonic wave sensor 10. The ultrasonic wave sensor 10 includes an upper electrode 11, a lower electrode 12, and a piezoelectric layer 13 located between the upper electrode 11 and the lower electrode 12. The piezoelectric layer 13 is manufactured by a piezoelectric material, and can be excited by a voltage to generate an inverse piezoelectric effect. As illustrated by FIG. 1, upon an alternating voltage (AC voltage) being input to the upper electrode 11 and the lower electrode 12 (for example, the upper electrode 11 is grounded and an alternating current wave is applied to the lower electrode 12), the piezoelectric layer 13 is deformed by the inverse piezoelectric effect and cause film layers above and below the piezoelectric layer 13 to vibrate together, so that ultrasonic waves can be generated and transmitted outward. It should be noted that, upon a side of the upper electrode 11 away from the piezoelectric layer 13 or a side of the lower electrode 12 away from the piezoelectric layer 13 being provided with a cavity (for example, an air cavity), the ultrasonic waves transmitted by the ultrasonic wave sensor are reinforced, so that the ultrasonic waves can be transmitted better.

As illustrated by FIG. 2, the ultrasonic waves transmitted by the ultrasonic wave sensor 10 are reflected by a fingerprint 500. Reflected ultrasonic waves are converted into an alternating voltage in the piezoelectric layer. Under this condition, the upper electrode 11 is grounded, and the lower electrode 12 serves as a receiving electrode to receive the alternating voltage generated by the piezoelectric layer. Because the fingerprint 500 includes valleys 510 and ridges 520, and abilities of the valleys 510 and the ridges 520 to reflect ultrasonic waves are different (the valleys 510 have more strong ability to reflect ultrasonic waves), intensities of the ultrasonic waves reflected by the valleys 510 and the ridges 520 are different. Therefore, whether the ultrasonic waves are an ultrasonic wave reflected by a valley or an ultrasonic wave reflected by a ridge is possible to be judged by an alternating voltage received by a receiving electrode.

Figure 3:
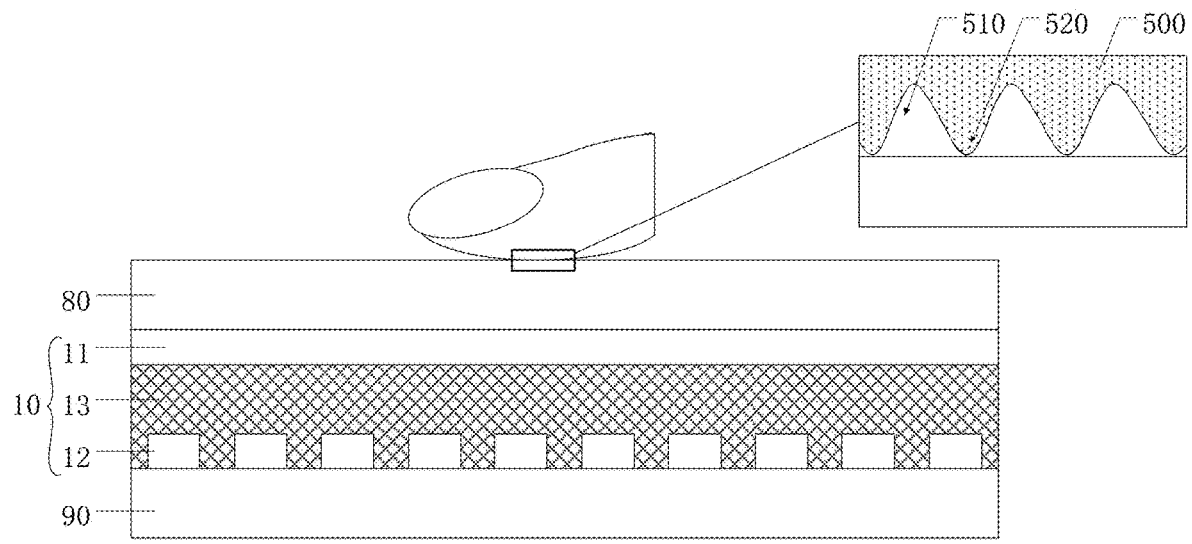
FIG. 3 is a schematic diagram of a fingerprint identification module performing a fingerprint identification.

FIG. 3 is a schematic diagram of a fingerprint identification module performing a fingerprint identification. As illustrated by FIG. 3, the fingerprint identification module includes an upper electrode 11, a plurality of lower electrodes 12, a piezoelectric layer 13 between the upper electrode 11 and the plurality of lower electrodes 12, a base substrate 80 located on a side of the upper electrode 11 away from the piezoelectric layer 13, and a protective layer 90 located on a side of the plurality of lower electrodes 12 away from the piezoelectric layer 13. The ultrasonic wave sensor 10 composed of the lower electrode 12, the piezoelectric layer 13, and the plurality of upper electrodes 11 can transmit ultrasonic waves as well as receive ultrasonic waves. That is, the ultrasonic wave sensor 10 is configured as both an ultrasonic wave transmitting sensor and an ultrasonic wave receiving sensor. Upon the fingerprint being in contact with the base substrate 80, the ultrasonic waves transmitted by the ultrasonic wave sensor 10 is reflected by the fingerprint 500, and the reflected ultrasonic waves are converted into an alternating voltage in the piezoelectric layer. Under this condition, the upper electrode 11 is grounded, and the plurality of lower electrodes 12 can serve as receiving electrodes, so that the alternating voltage generated by the piezoelectric layer is received at different positions. Because the fingerprint 500 includes valleys 510 and ridges 520, and abilities of the valleys 510 and the ridges 520 to reflect ultrasonic waves are different (the valleys 510 have more strong ability to reflect ultrasonic waves), intensities of the ultrasonic waves reflected by the valleys 510 and the ridges 520 are different. Therefore, positional information of the valleys and ridges of the fingerprint 500 can be obtained by the alternating voltages received by the plurality of lower electrodes 12, so that the fingerprint recognition can be achieved.

Figure 4:
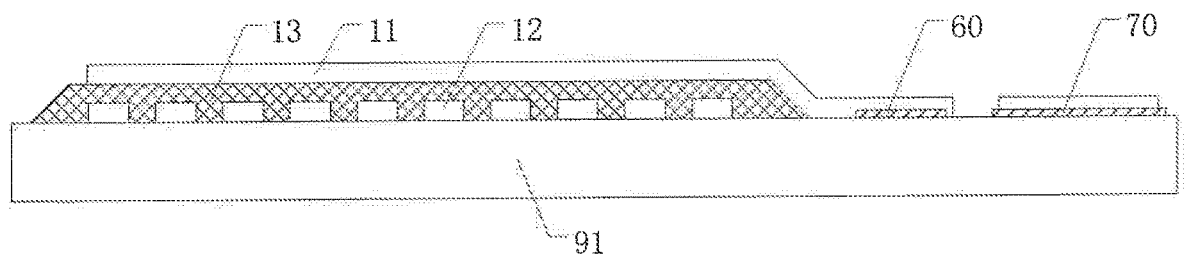
FIG. 4 is a structural schematic diagram of a fingerprint identification module.

FIG. 4 is a structural schematic diagram of a fingerprint identification module. As illustrated by FIG. 4, the upper electrode 11, the lower electrode 12, and the piezoelectric layer 13 may be formed at the same side of a thin film transistor substrate 91. The fingerprint identification module further includes: a bias resistor 60 and a bonding pad 70. The bias resistor 60 can be configured to calibrate a voltage. The bonding pad 70 can be configured to bond an external circuit.

Figure 5:
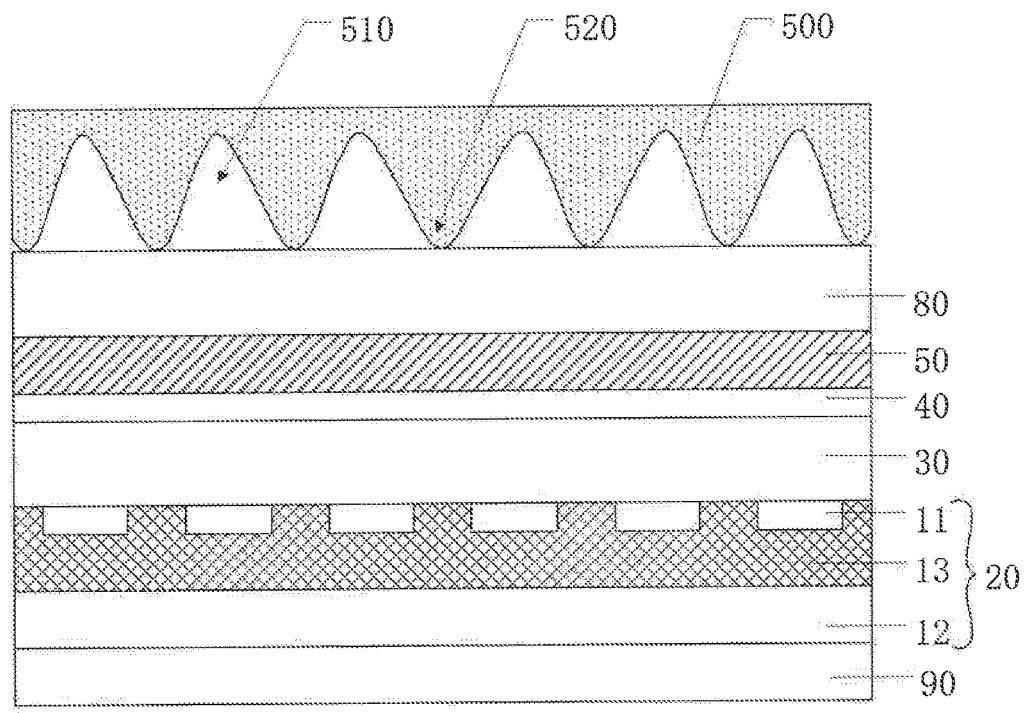
FIG. 5 is a structural schematic diagram of a display device.

FIG. 5 is a structural schematic diagram of a display device. As illustrated by FIG. 5, the display device includes a base substrate 80, a display module 50, a glue layer 40, a back plate 30, a fingerprint identification module 20, and a protective layer 90. The base substrate 80, the display module 50, the glue layer 40, the back plate 30, the fingerprint identification module 20, and the protective layer 90 are sequentially stacked. The display module 50 can be configured to display a picture. The base substrate 80 has a contact surface 81 to be contacted by the fingerprint. The glue layer 40 is configured to bond the display module 50 to the back plate 30. The fingerprint identification module 20 includes a plurality of upper electrodes 11 configured as receiving electrodes, a lower electrode 12 configured as a driving electrode, and a piezoelectric layer 13 located between the plurality of upper electrodes 11 and the lower electrodes 12. The display device simultaneously achieves a display function and a fingerprint identification function by bonding the display module 50 and the fingerprint recognition module 20 together. Moreover, the fingerprint identification module further achieves a touch function.

However, in order to make the fingerprint identification module 20 have a high receiving sensitivity to receive ultrasonic waves, the piezoelectric layer 13 is usually manufactured by a piezoelectric material such as PVDF (polyvinylidene fluoride). However, the ultrasonic wave sensors manufactured by such piezoelectric material have relatively low ultrasonic wave transmitting efficiencies. Therefore, the ultrasonic waves generated by the ultrasonic wave sensors have a lower energy under limited driving conditions. In a case where a distance between the ultrasonic wave sensors and the fingerprint is large (for example, in a technical solution of fingerprint identification under a screen, a device such as a display module is further provided between the fingerprint identification module and the fingerprint), a transmission loss of the ultrasonic waves is large, thereby resulting in low energy of the ultrasonic waves reaching a fingerprint interface, which affects a fingerprint identification performance. On the other hand, in order to make the ultrasonic waves of the ultrasonic wave sensors manufactured by PVDF transmit the ultrasonic wave having a higher intensity, the lower electrode 12, that is, the driving electrode needs to be made thicker (needs to load a high voltage). For example, the lower electrode 12 needs to be manufactured by silver (Ag) having a high conductivity and a thickness of more than 10 microns in order to drive the piezoelectric layer 13 manufactured by PVDF to generate ultrasonic waves having sufficient strength. However, manufacture of a relatively thick silver layer requires to adopt processes such as a silk screen printing process, etc. Therefore, on the one hand, costs of manufacturing a thicker silver layer are relatively high, and on the other hand, it is relatively difficult to manufacture a relatively thick silver layer.

Embodiments of the present disclosure provide a fingerprint identification module, a manufacturing method of the fingerprint identification module, a driving method of the fingerprint identification module and a display device. A fingerprint identification module includes: a plurality of ultrasonic wave receiving sensors configured to receive an ultrasonic wave and at least one ultrasonic wave transmitting sensor configured to transmit an ultrasonic wave. Each of the plurality of ultrasonic wave receiving sensors includes a first piezoelectric material layer. Each of the at least one ultrasonic wave transmitting sensor includes a second piezoelectric material layer, and a material of the first piezoelectric material layer is different from a material of the second piezoelectric material layer. The fingerprint identification module utilizes the ultrasonic wave sensors having different piezoelectric materials to respectively achieving transmitting ultrasonic wave and receiving ultrasonic wave in the fingerprint identification process. The ultrasonic wave sensors of a piezoelectric material having a relatively large piezoelectric strain constant are configured to transmit ultrasonic wave. The ultrasonic wave sensors of a piezoelectric material having a relatively small piezoelectric strain constant are configured to receive ultrasonic wave. Therefore, on the one hand, the energy of the ultrasonic wave transmitted by the fingerprint identification module is increased to improve the fingerprint identification performance. On the other hand, the manufacturing costs and the manufacturing difficulty of the fingerprint identification module are reduced.

Hereinafter, the fingerprint identification module, the manufacturing method of the fingerprint identification module, the driving method of the fingerprint identification module, and the display device provided by the embodiments of the present disclosure are described in detail below with reference to the accompanying drawings.

Figure 6:
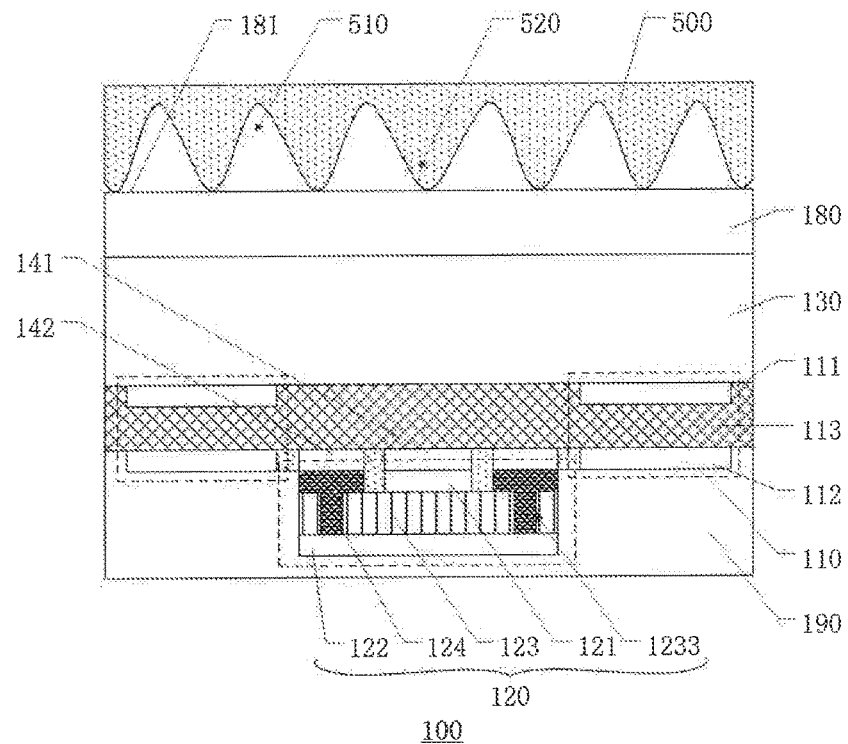
FIG. 6 is a structural schematic diagram of a fingerprint identification module provided by an embodiment of the present disclosure.

An embodiment of the present disclosure provides a fingerprint identification module. FIG. 6 is a structural schematic diagram of a fingerprint identification module provided by an embodiment of the present disclosure. As illustrated by FIG. 6, the fingerprint identification module 100 includes a plurality of ultrasonic wave receiving sensors 110 configured to receive an ultrasonic wave, and at least one ultrasonic wave transmitting sensor 120 configured to transmit an ultrasonic wave. Each of the plurality of ultrasonic wave receiving sensors 110 includes a first piezoelectric material layer 113. Each of the at least one ultrasonic wave transmitting sensor 120 includes a second piezoelectric material layer 123, and a material of the first piezoelectric material layer 123 is different from a material of the second piezoelectric material layer 113.

In the fingerprint identification module provided by the embodiments of the present disclosure, the ultrasonic wave sensors having different piezoelectric materials are utilized to respectively achieve transmitting ultrasonic wave and receiving ultrasonic wave in the fingerprint identification process. The ultrasonic wave transmitting sensors with high ultrasonic wave transmitting efficiency are configured to transmit the ultrasonic wave under the same voltage driving conditions. The ultrasonic wave receiving sensors with high ultrasonic receiving efficiency are configured to receive ultrasonic waves under the same voltage driving conditions. Therefore, on the one hand, the energy or the intensity of the ultrasonic wave transmitted by the fingerprint identification module is improved, upon the distance between the ultrasonic wave transmitting sensor and the fingerprint being large (for example, in a technical solution of fingerprint identification under a screen, a device such as a display module is further provided between the fingerprint identification module and the fingerprint), and even if the ultrasonic wave is lost during transmission, the energy of the ultrasonic wave reaching the fingerprint still has a high energy or a high intensity, thereby improving fingerprint identification performance. On the other hand, because the energy or the intensity of the ultrasonic wave transmitted from the ultrasonic wave transmitting sensor is large, and the ultrasonic wave is a spherical wave, the ultrasonic wave transmitting sensor of the same size can cover a large range. Therefore, the fingerprint identification module does not need to provide a large number of ultrasonic wave transmitting sensors which are closely arranged, and a fingerprint identification requirement can be satisfied only by a few or even one ultrasonic wave transmitting sensor.

For example, in some examples, a piezoelectric strain constant of the second piezoelectric material layer 123 is greater than a piezoelectric strain constant of the first piezoelectric material layer 113. Thus, the fingerprint identification module utilizes the ultrasonic wave transmitting sensors of piezoelectric materials having a large piezoelectric strain constant to transmit the ultrasonic waves, and utilizes the ultrasonic wave receiving sensors of piezoelectric materials having a small piezoelectric strain constant to receive ultrasonic waves. Therefore, on the one hand, the energy or the intensity of the ultrasonic wave transmitted by the fingerprint identification module is improved, upon the distance between the ultrasonic wave transmitting sensor and the fingerprint being large (for example, in a scheme of fingerprint identification under a screen, a device such as a display module is further provided between the fingerprint identification module and the fingerprint), and even if the ultrasonic wave is lost during transmission, the energy of the ultrasonic wave reaching the fingerprint still has a high energy or a high intensity, thereby improving fingerprint identification performance. In addition, because a piezoelectric strain coefficient of the second piezoelectric material of the ultrasonic wave transmitting sensor is large, the driving electrode of the ultrasonic wave transmitting sensor is not required to be made thick, so that the manufacturing difficulty and the manufacturing cost can be reduced.

For example, in some examples, because the ultrasonic wave receiving sensor is only configured to receive the ultrasonic wave and does not transmit the ultrasonic wave, a thickness of the second receiving electrode can be designed to be thin. For example, the thickness of the second receiving electrode 112 is less than 10 micrometers, thereby reducing the manufacturing difficulty and the manufacturing cost of the fingerprint identification module. Because the ultrasonic wave receiving sensor is only configured to receive the ultrasonic wave and does not transmit the ultrasonic wave, the thickness of the second receiving electrode can be designed to be thin, thereby reducing the manufacturing difficulty and the manufacturing costs of the fingerprint identification module.

For example, in some examples, the second receiving electrode 112 can be manufactured by molybdenum and has a thickness of 3000 Å. Therefore, the second receiving electrode 112 can be formed by only one sputtering process, thereby reducing the manufacturing difficulty and the manufacturing costs of the fingerprint identification module. Of course, embodiments of the present disclosure include but are not limited thereto. The second receiving electrode 112 may further be manufactured by other materials, and may have other thicknesses.

For example, in some examples, in order to make the ultrasonic wave receiving sensor have a higher sensitivity to ultrasonic waves, a piezoelectric voltage constant of the first piezoelectric material layer 113 may be greater than a piezoelectric voltage constant of the second piezoelectric material layer 123.

For example, in some examples, as illustrated by FIG. 6, each of the plurality of ultrasonic wave receiving sensors 110 further includes a first receiving electrode 111 and a second receiving electrode 11. The first receiving electrode 111 is located on a side of the first piezoelectric material layer 113, and the second receiving electrode 112 is located on a side of the first piezoelectric material layer 113 away from the first receiving electrode 111. Each of ultrasonic wave transmitting sensors 120 further includes a first transmitting electrode 121 and a second transmitting electrode 122. The first transmitting electrode 121 is located on a side of the second piezoelectric material layer 123, and the second transmitting electrode 122 is located on a side of the second piezoelectric material layer 123 away from the first transmitting electrode 121. For example, an alternating voltage may be applied between the first transmitting electrode 121 and the second transmitting electrode 122 to drive the second piezoelectric material layer 123 to transmit the ultrasonic wave. The alternating voltage generated by reflected ultrasonic waves of the first piezoelectric material layer 113 can be received by the first receiving electrode 111 by connecting the second receiving electrode 112 to a fixed potential.

For example, in some examples, the material of the first piezoelectric material layer includes a PVDF (polyvinylidene fluoride), and the material of the second piezoelectric material layer includes an aluminum nitride (AlN) or a lead zirconate titanate piezoelectric ceramic (PZT).

For example, in some examples, as illustrated by FIG. 6, the fingerprint identification module 100 further includes a base substrate 180 located on a side of the first receiving electrode 111 away from the first piezoelectric material layer 113. The base substrate 180 includes a contact surface 181 configured to be contacted by a fingerprint 500. Upon the fingerprint 500 being in contact with the contact surface 181, the fingerprint identification module 100 can transmit the ultrasonic wave to the fingerprint 500 through the ultrasonic wave transmitting sensor 120, and receive the ultrasonic wave (echo wave) reflected by the fingerprint 500 through the ultrasonic wave receiving sensor 110 to realize the identification of the fingerprint 500. Of course, the embodiments of the present disclosure include but are not limited thereto. Upon the fingerprint identification module 100 being configured for a display device, the base substrate 180 may be a cover plate of the display device.

For example, in some examples, the first transmitting electrode 121 is located on a side of the second receiving electrode 112 away from the base substrate 180. That is, the ultrasonic wave transmitting sensor 120 is located on a side of the ultrasonic wave receiving sensor 110 away from the substrate 180, so that the ultrasonic wave receiving sensor 110 can be closer to the fingerprint 500, thereby improving the performance of fingerprint identification. Of course, the embodiments of the present disclosure include but are not limited thereto. The ultrasonic wave transmitting sensor 120 and the ultrasonic wave receiving sensor 110 may further be provided in the same layer. It should be noted that, the ultrasonic wave transmitting sensor and the ultrasonic wave receiving sensor are provided in the same layer, and respective layers of the ultrasonic wave transmitting sensor and the ultrasonic wave receiving sensor are not required to be provided in the same layer as long as the ultrasonic wave transmitting sensor and the ultrasonic wave receiving sensor are not sequentially provided in a direction perpendicular to the substrate or the first piezoelectric material layer.

For example, in some examples, as illustrated by FIG. 6, the fingerprint identification module 100 further includes a first contact electrode 141; and a second contact electrode 142. The first contact electrode 141 and the second contact electrode 142 are provided in a same layer with the second receiving electrode 112. Each of the at least one ultrasonic wave transmitting sensor 120 further includes a via hole 1233 and a connection electrode 124 which are located in the second piezoelectric material layer 123. The first contact electrode 141 is directly in contact with the first transmitting electrode 121. The connection electrode 124 passes through the via hole to electrically connect the second transmitting electrode 122 and the second contact electrode 142. That is, the ultrasonic wave transmitting sensor 120 may transfer a prepared or manufactured ultrasonic wave transmitting sensor in advance to the side of the ultrasonic wave receiving sensor away from the base substrate by a transfer process. Therefore, the manufacturing difficulty of the fingerprint identification module can be further reduced, and the manufacturing efficiency of the fingerprint recognition module can be improved.

For example, in some examples, as illustrated by FIG. 6, the fingerprint identification module 100 further includes a driving circuit layer 130 for driving the ultrasonic wave transmitting sensor and the ultrasonic wave receiving sensor. The driving circuit layer 130 may include a thin film transistor such as a complementary metal oxide semiconductor (CMOS) thin film transistor.

Figure 7:
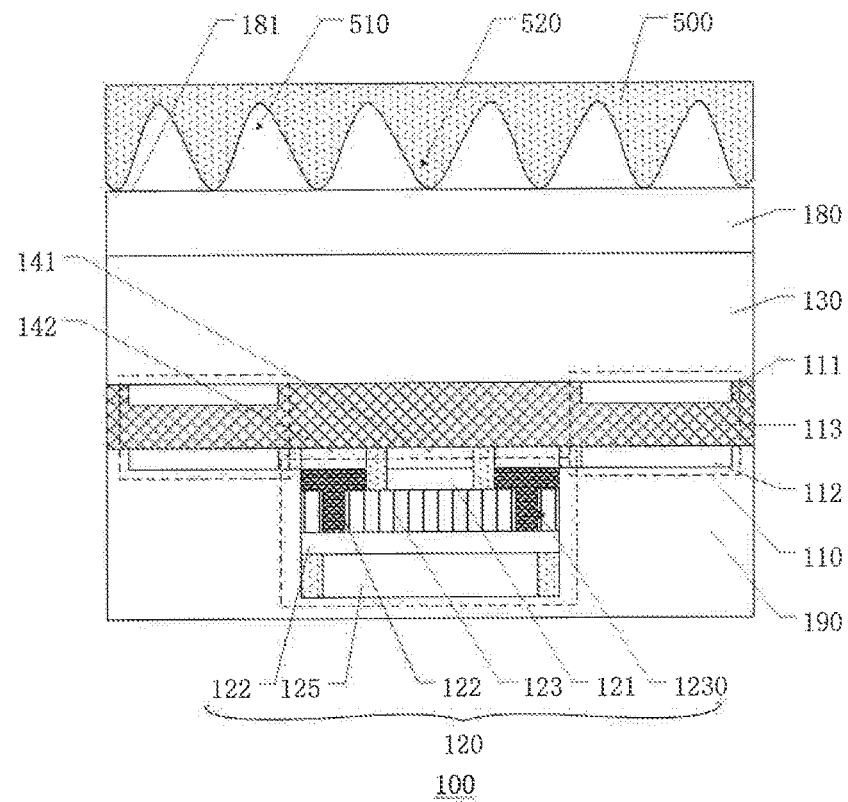
FIG. 7 is a structural schematic diagram of another fingerprint identification module provided by an embodiment of the present disclosure.

FIG. 7 is a structural schematic diagram of another fingerprint identification module provided by an embodiment of the present disclosure. As illustrated by FIG. 7, in the fingerprint identification module, the second piezoelectric material layer 123 may be manufactured by aluminum nitride (AlN). Under this condition, a cavity 125 may be provided on a side of the second transmitting electrode 122 away from the second piezoelectric material layer 123, so that the ultrasonic wave transmitting sensor 120 may have a high ultrasonic wave transmitting efficiency along a direction perpendicular to the second piezoelectric material layer 123. It should be noted that, the cavity may further be provided on a side of the first transmitting electrode 121 away from the second piezoelectric material layer 123.

For example, as illustrated by FIG. 7, the cavity 125 may be a through hole or a blind hole in a layered structure. For example, the layered structure may be a glass substrate, a plastic substrate, etc.

Figure 8:
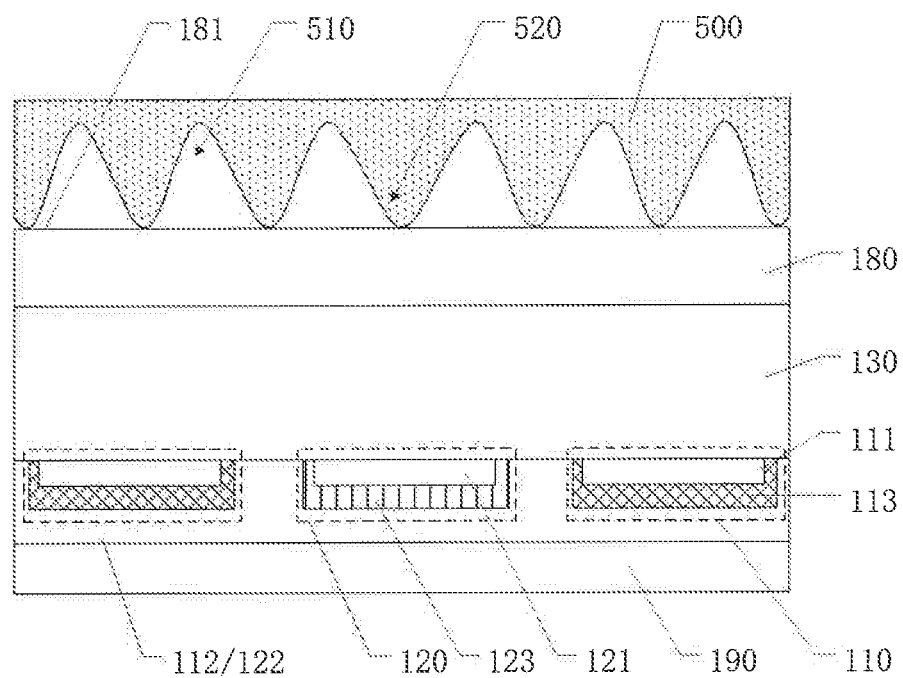
FIG. 8 is a structural schematic diagram of another fingerprint identification module provided by an embodiment of the present disclosure.

FIG. 8 is a structural schematic diagram of another fingerprint identification module provided by an embodiment of the present disclosure. As illustrated by FIG. 8, the ultrasonic wave transmitting sensor 120 and the ultrasonic wave receiving sensor 110 are provided in a same layer. The first transmitting electrode 121 and the first receiving electrode 111 are provided in a same layer. The second transmitting electrode 122 and the second receiving electrode 112 are provided in a same layer.

Figure 9A:
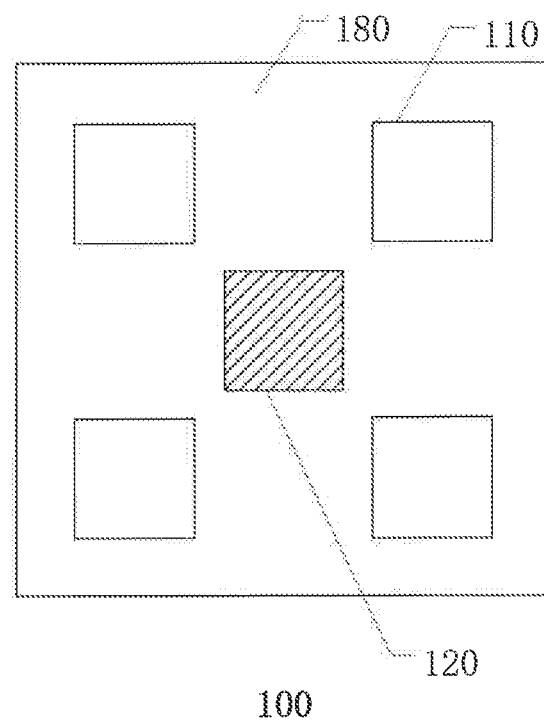
FIG. 9A is a distribution schematic diagram of an ultrasonic wave transmitting sensor and an ultrasonic wave receiving sensor in a fingerprint identification module provided by an embodiment of the present disclosure.
Figure 9B:
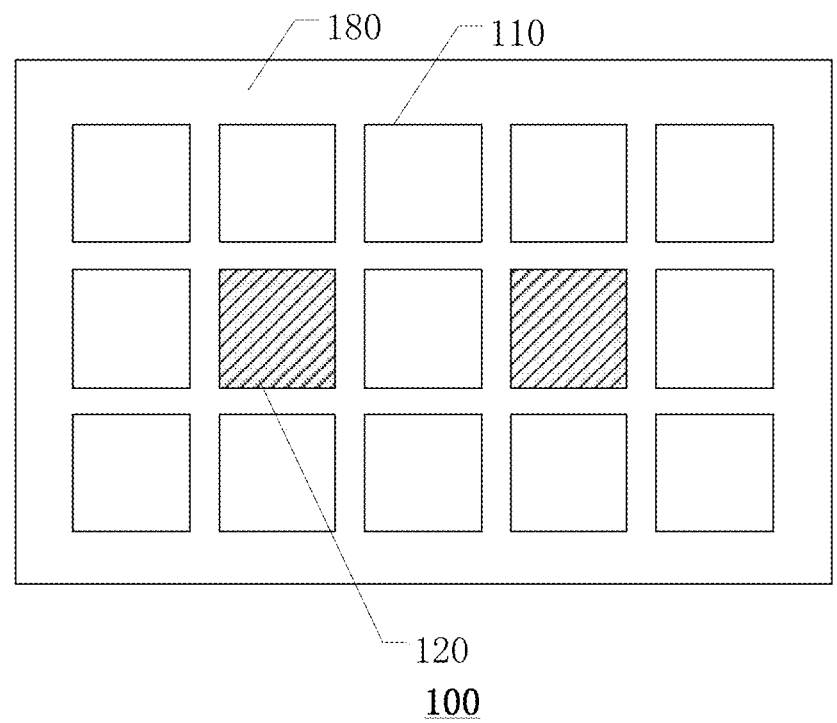
FIG. 9B is a distribution schematic diagram of an ultrasonic wave transmitting sensor and an ultrasonic wave receiving sensor in another fingerprint identification module provided by an embodiment of the present disclosure.

FIG. 9A is a distribution schematic diagram of an ultrasonic wave transmitting sensor and an ultrasonic wave receiving sensor according to a fingerprint identification module provided by an embodiment of the present disclosure. FIG. 9B is a distribution schematic diagram of an ultrasonic wave transmitting sensor and an ultrasonic wave receiving sensor according to another fingerprint identification module provided by an embodiment of the present disclosure. As illustrated by FIG. 9A, the fingerprint identification module includes an ultrasonic wave transmitting sensor 120, and a plurality of ultrasonic wave receiving sensors 110 are provided around the ultrasonic wave transmitting sensor 120. That is, an orthographic projection of the ultrasonic wave transmitting sensor 120 on the base substrate 180 is between orthographic projections of two adjacent ultrasonic wave receiving sensors 110 on the base substrate 180. As illustrated by FIG. 9B, the fingerprint identification module may further include a plurality of ultrasonic wave transmitting sensors 120. The plurality of ultrasonic wave transmitting sensors 120 and the plurality of ultrasonic wave receiving sensors 110 are arranged in an array. Besides, orthographic projections of the plurality of ultrasonic wave transmitting sensors 120 on the substrate 180 are located between the orthographic projections of two adjacent ultrasonic wave receiving sensors 110 on the base substrate 180. In a case where the fingerprint identification module further includes a plurality of ultrasonic wave transmitting sensors 120, each of the ultrasonic wave transmitting sensors 120 is configured to detect or identify a partial pattern of the fingerprint, and then the partial pattern detected or identified by the plurality of ultrasonic wave transmitting sensors can be spliced to obtain a complete fingerprint pattern.

Figure 10:
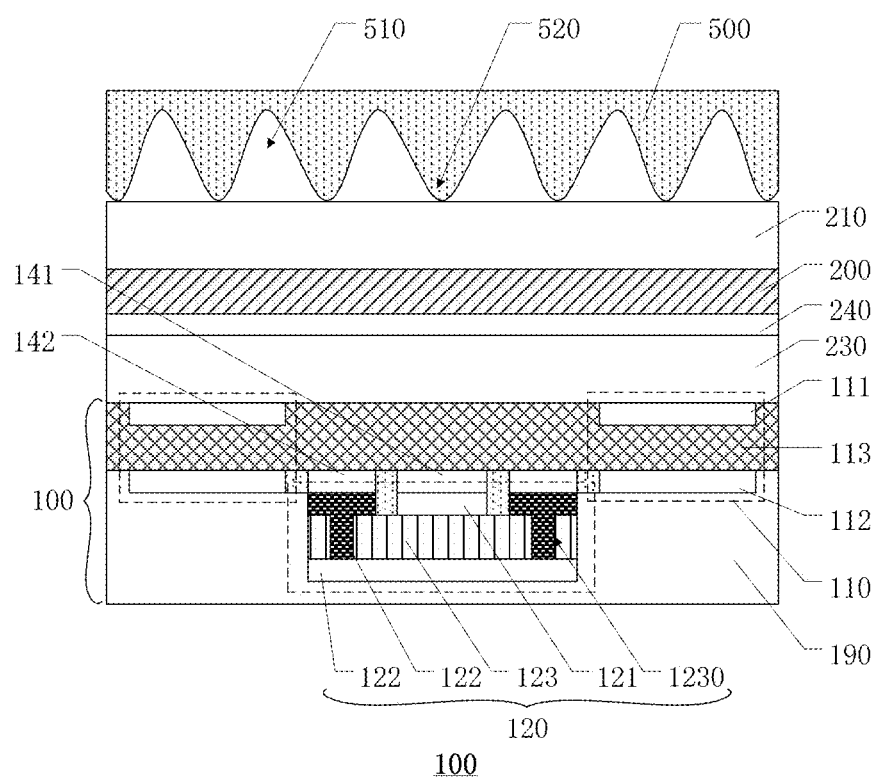
FIG. 10 is a structural schematic diagram of a display device provided by an embodiment of the present disclosure.

An embodiment of the present disclosure further provides a display device. FIG. 10 is a structural schematic diagram according to a display device provided by an embodiment of the present disclosure. As illustrated by FIG. 10, the display device includes the fingerprint identification module 100 described in the above embodiments. Therefore, the display device has a high fingerprint identification performance while achieving display and fingerprint identification, and has a low manufacturing difficulty and a low manufacturing cost. For details, reference may be made to relevant description in the above embodiments.

For example, in some examples, as illustrated by FIG. 10, the display device further includes a display module 200. An area of the display module 200 is substantially the same as an area of the fingerprint identification module 100, so that full-screen fingerprint identification can be realized. Under this condition, the fingerprint identification module can further achieve a touch control function, thereby eliminating the need to provide an additional touch control device, such as a capacitive touch control panel, and thereby reducing the costs of the display device. Of course, the embodiments of the present disclosure are not limited thereto. The area of the display model may further be different from the area of the fingerprint identification module. The fingerprint identification module may be provided only in a region where the fingerprint identification is needed.

For example, in some examples, the display device further includes a cover plate 210 located on a side of the display module 200 away from the fingerprint identification module 100, a bottom plate 230 located on a side of the display module 200 close to the fingerprint identification module 100, and a glue layer configured to bond the display module 200 to the bottom plate 230.

For example, the display device may be an electronic device with a display function such as a television, a mobile phone, a computer, a notebook computer, an electronic photo album, a navigator, etc.

Figure 11:
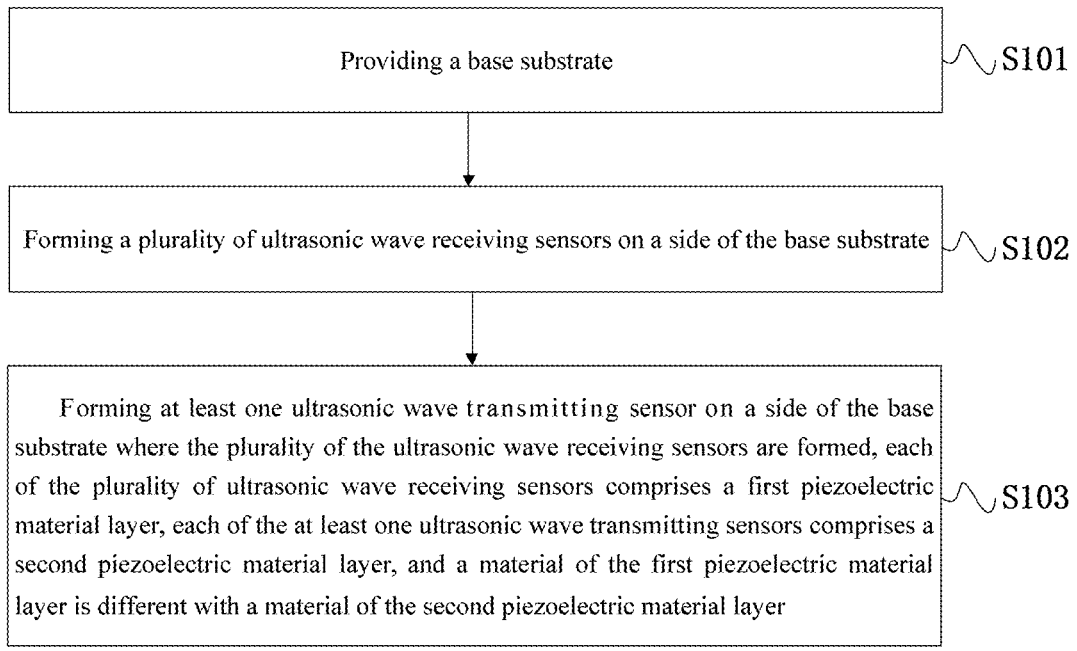
FIG. 11 is flowchart of a manufacturing method of a fingerprint identification module provided by an embodiment of the present disclosure.

An embodiment of the present disclosure further provides a manufacturing method of a fingerprint identification module. FIG. 11 is flowchart according to a manufacturing method of a fingerprint identification module provided by an embodiment of the present disclosure. As illustrated by FIG. 11, the manufacturing method includes following steps S101-S103.

Step S101: providing a base substrate.

For example, the base substrate may be a back plate at a side of the display module 200, so that the fingerprint identification module can be directly integrated into the display device. Of course, the embodiments of the present disclosure are not limited thereto. The base substrate may further be a single base substrate. The material of the base substrate may be a material such as glass, polyimide, or silica, etc.

Step S102: forming a plurality of ultrasonic wave receiving sensors on a side of the base substrate.

For example, a conductive film layer may be formed on the base substrate by a sputtering process or a vapor deposition process, and then electrodes (a first receiving electrode and a second receiving electrode) of the ultrasonic wave receiving sensor are formed by a patterning process. The first piezoelectric material layer may be formed by a coating process or a vapor deposition process.

Step S103: forming at least one ultrasonic wave transmitting sensor on a side of the base substrate where the plurality of the ultrasonic wave receiving sensors are formed. Each of the plurality of ultrasonic wave receiving sensors includes a first piezoelectric material layer. Each of the at least one ultrasonic wave transmitting sensors includes a second piezoelectric material layer. A material of the first piezoelectric material layer is different from a material of the second piezoelectric material layer.

In the manufacturing method of the fingerprint identification module provided by the embodiments of the present disclosure, the ultrasonic wave sensors having different piezoelectric materials is utilized to respectively achieve transmitting ultrasonic wave and receiving ultrasonic wave in the fingerprint identification process. The ultrasonic wave transmitting sensors with high ultrasonic wave transmitting efficiency are configured to transmit the ultrasonic wave under the same voltage driving conditions. The ultrasonic wave receiving sensors with high ultrasonic receiving efficiency are configured to receive ultrasonic waves under the same voltage driving conditions. Therefore, on the one hand, the energy or the intensity of the ultrasonic wave transmitted by the fingerprint identification module is improved, in a case where the distance between the ultrasonic wave transmitting sensor and the fingerprint is large (for example, in a technical solution of fingerprint identification under a screen, a device such as a display module is further provided between the fingerprint identification module and the fingerprint), and even if the ultrasonic wave is lost during transmission, the energy of the ultrasonic wave reaching the fingerprint still has a high energy or a high intensity, thereby improving fingerprint identification performance.

For example, in some examples, a piezoelectric strain constant of the second piezoelectric material layer is greater than a piezoelectric strain constant of the first piezoelectric material layer. Thus, the fingerprint identification module utilizes the ultrasonic wave transmitting sensors of piezoelectric materials having a large piezoelectric strain constant to transmit the ultrasonic waves, and utilizes the ultrasonic wave receiving sensors of piezoelectric materials having a small piezoelectric strain constant to receive ultrasonic waves. Therefore, on the one hand, the energy or the intensity of the ultrasonic wave transmitted by the fingerprint identification module is improved, in a case where the distance between the ultrasonic wave transmitting sensor and the fingerprint is large (for example, in a scheme of fingerprint identification under a screen, a device such as a display module is further provided between the fingerprint identification module and the fingerprint), and even if the ultrasonic wave is lost during transmission, the energy of the ultrasonic wave reaching the fingerprint still has a high energy or a high intensity, thereby improving fingerprint identification performance. In addition, because a piezoelectric strain coefficient of the second piezoelectric material of the ultrasonic wave transmitting sensor is large, the driving electrode of the ultrasonic wave transmitting sensor is not required to be made thick, so that the manufacturing difficulty and the manufacturing costs can be reduced.

For example, in some examples, forming the at least one ultrasonic wave transmitting sensor on the side of the base substrate where the plurality of the ultrasonic wave receiving sensors are formed includes: providing the at least one ultrasonic wave transmitting sensor, and transferring the at least one ultrasonic wave transmitting sensor on the side of the ultrasonic wave receiving sensors away from the base substrate by a transfer process. Therefore, the manufacturing method can further reduce the manufacturing difficulty and the manufacturing costs, and it is suitable for bonding an ultrasonic wave transmitting sensor manufactured by an inorganic piezoelectric material (for example, AlN or PZT) to the side of the ultrasonic wave receiving sensor away from the base substrate. Of course, the embodiments of the present disclosure include, but are not limited thereto. At least one ultrasonic wave transmitting sensor can be formed directly on the side of the base substrate where the plurality of ultrasonic wave receiving sensors are formed without the transfer process.

For example, in some examples, forming the plurality of ultrasonic wave receiving sensors on the side of the base substrate includes: forming a plurality of first receiving electrodes on the side of the base substrate; forming a first piezoelectric material layer on the side of the plurality of the first receiving electrodes away from the base substrate; and forming a plurality of second receiving electrodes in one-to-one correspondence with the plurality of the first receiving electrodes on the side of the first piezoelectric material layer, the plurality of the first receiving electrodes and the plurality of the second receiving electrodes that are in one-to-one correspondence and the first piezoelectric material layer constitute the plurality of the ultrasonic wave receiving sensors.

For example, the conductive film layer may be formed on the base substrate by a sputtering process or a vapor deposition process. The first receiving electrode is then formed by a patterning process. The first piezoelectric material layer is formed by a coating process or a vapor deposition process. A conductive film layer is then formed on the base substrate by a sputtering process or a vapor deposition process. A second receiving electrode is then formed by a patterning process.

For example, the first receiving electrode can be manufactured by indium tin oxide (ITO). The second receiving electrode can be manufactured by a metal material such as molybdenum, copper or silver, etc.

For example, in some examples, the manufacturing method of the fingerprint identification module further includes: forming a first contact electrode and a second contact electrode in a same layer with the plurality of the second receiving electrodes while forming the plurality of the second receiving electrodes.

For example, in some examples, the ultrasonic wave transmitting sensor includes a first transmitting electrode, a second piezoelectric material layer, a second transmitting electrode, and a via hole and a connection electrode that are located in the second piezoelectric material layer. Transferring the at least one ultrasonic wave transmitting sensor on the side of the ultrasonic wave receiving sensors away from the base substrate by a transfer process includes: connecting the first transmitting electrode and the first contact electrode, and connecting the connection electrode and the second contact electrode. The connection electrode passes through the via hole to electrically connect the second transmitting electrode and the second contact electrode. Therefore, the manufacturing difficulty of the fingerprint identification module can be further reduced, and the manufacturing efficiency of the fingerprint recognition module can be improved.

Figure 12:
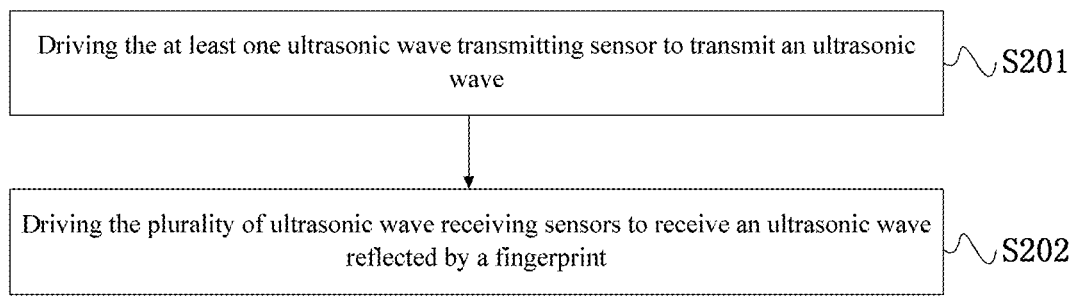
FIG. 12 is flowchart of a driving method of a fingerprint identification module provided by an embodiment of the present disclosure.

An embodiment of the present disclosure further provides a driving method of a fingerprint identification module. FIG. 12 is flowchart of a driving method of a fingerprint identification module provided by an embodiment of the present disclosure. As illustrated by FIG. 12, the manufacturing method includes following steps S201-S202.

In step S201, the at least one ultrasonic wave transmitting sensor is driven to transmit an ultrasonic wave.

In step S202, the plurality of ultrasonic wave receiving sensors are driven to receive an ultrasonic wave reflected by a fingerprint.

The driving method of the fingerprint identification module utilizes the ultrasonic wave transmitting sensors of piezoelectric materials having a large piezoelectric strain constant to transmit the ultrasonic waves, and utilizes the ultrasonic wave receiving sensors of piezoelectric materials having a small piezoelectric strain constant to receive ultrasonic waves. Therefore, the energy or the intensity of the ultrasonic wave transmitted by the fingerprint identification module is improved, in a case where the distance between the ultrasonic wave transmitting sensor and the fingerprint is large (for example, in a scheme of fingerprint identification under a screen, a device such as a display module is further provided between the fingerprint identification module and the fingerprint), and even if the ultrasonic wave is lost during transmission, the energy of the ultrasonic wave reaching the fingerprint still has a high energy or a high intensity, thereby improving fingerprint identification performance.

Figure 13A:
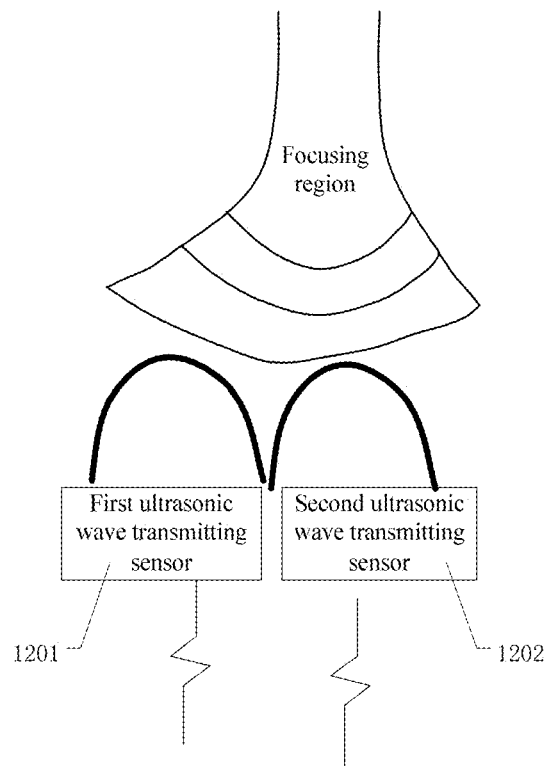
FIG. 13A is a schematic diagram of a plurality of ultrasonic wave transmitting sensors of a fingerprint identification module provided by an embodiment of the present disclosure.

For example, in some examples, the at least one ultrasonic wave transmitting sensor includes a first ultrasonic wave transmitting sensor and a second ultrasonic wave transmitting sensor. FIG. 13A is a schematic diagram of a plurality of ultrasonic wave transmitting sensors of a fingerprint identification module provided by an embodiment of the present disclosure. As illustrated by FIG. 13A, the fingerprint identification module includes a first ultrasonic wave transmitting sensor 1201 and a second ultrasonic wave transmitting sensor 1202. The driving method includes that the first ultrasonic wave transmitting sensor is driven to transmit an ultrasonic wave at a first time point, and the second ultrasonic wave transmitting sensor is driven to transmit an ultrasonic wave at a second time point, so that a phase of the ultrasonic wave transmitted by the second ultrasonic wave transmitting sensor is delayed with respect to a phase of the ultrasonic wave transmitted by the first ultrasonic wave transmitting sensor. For example, as illustrated by FIG. 13A, a focusing (incremental interference) of the ultrasonic wave is realized directly above the second ultrasonic wave transmitting sensor 1202 by the driving method. That is the intensity of the ultrasonic wave or the energy of the ultrasonic wave directly above the second ultrasonic wave transmitting sensor 1202 is enhanced, so that the fingerprint identification module can not only realize fingerprint identification, but also penetrate the finger to distinguish whether the fingerprint is a true skin. It should be noted that, the second time point is later than the first time point. It should be noted that a delay amount of the phase of the ultrasonic wave transmitted by the second ultrasonic wave transmitting sensor and the phase of the ultrasonic wave transmitted by the first ultrasonic wave transmitting sensor can be obtained by detection according to actual conditions.

Figure 13B:
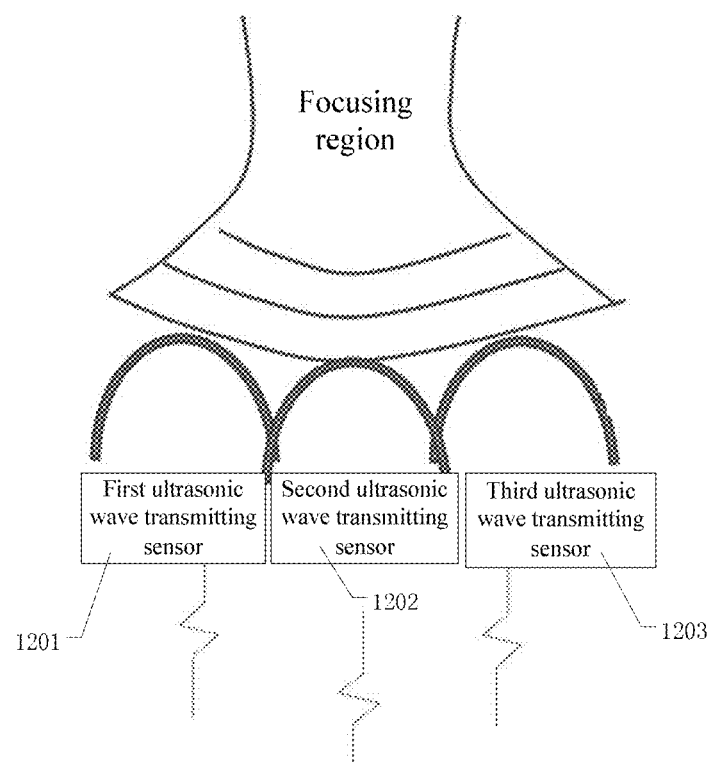
FIG. 13B is a schematic diagram of a plurality of ultrasonic wave transmitting sensors of a fingerprint identification module provided by an embodiment of the present disclosure.

For example, in some examples, the at least one ultrasonic wave transmitting sensor includes a first ultrasonic wave transmitting sensor, a second ultrasonic wave transmitting sensor and a third ultrasonic wave transmitting sensor. FIG. 13B is a schematic diagram of a plurality of ultrasonic wave transmitting sensors of a fingerprint identification module provided by an embodiment of the present disclosure. For example, as illustrated by FIG. 13B, the fingerprint identification module includes a first ultrasonic wave transmitting sensor 1201, a second ultrasonic wave transmitting sensor 1202 and a third ultrasonic wave transmitting sensor 1203. The driving method includes that the first ultrasonic wave transmitting sensor and the third ultrasonic wave transmitting sensor are driven to transmit an ultrasonic wave at the first time point, and the second ultrasonic wave transmitting sensor is driven to transmit an ultrasonic wave at a second time point, so that a phase of the ultrasonic wave transmitted by the second ultrasonic wave transmitting sensor is delayed with respect to a phase of the ultrasonic wave transmitted by the first ultrasonic wave transmitting sensor and the third ultrasonic wave transmitting sensor. As illustrated by FIG. 13B, a focusing of the ultrasonic wave is realized directly above the second ultrasonic wave transmitting sensor 1202 by the driving method. That is the intensity of the ultrasonic wave or the energy of the ultrasonic wave directly above the second ultrasonic wave transmitting sensor 1202 is enhanced, so that the fingerprint identification module can not only realize fingerprint identification, but also penetrate the finger to distinguish whether the fingerprint is a true skin. It should be noted that the second time point is later than the first time point.

For example, two or more ultrasonic wave transmitting sensors are driven to transmit ultrasonic waves as illustrated by FIG. 13A and FIG. 13B. The ultrasonic waves are focused directly above the ultrasonic wave transmitting sensors with delayed transmitting. Therefore, the ultrasonic wave receiving sensor corresponding to the ultrasonic wave transmitting sensors with delayed transmitting can be turned on according to a reflected echo time of the ultrasonic wave transmitting sensors with delayed transmitting to receive a reflected echo.

It should be noted that when the plurality of driving electrodes are driven by the method shown in FIG. 13A or FIG. 13B, two or more ultrasonic wave transmitting sensors can be used as a group of ultrasonic wave transmitting sensor groups. Delay driving can be performed in each of the ultrasonic wave transmitting sensor groups in accordance with the method shown in FIG. 13A or FIG. 13B. However, different ultrasonic wave transmitting sensor groups have no influence on each other, and can be driven at the same time or driven by a scanning driving, thereby reducing an identification time of entire fingerprint identification module.

Figure 14:
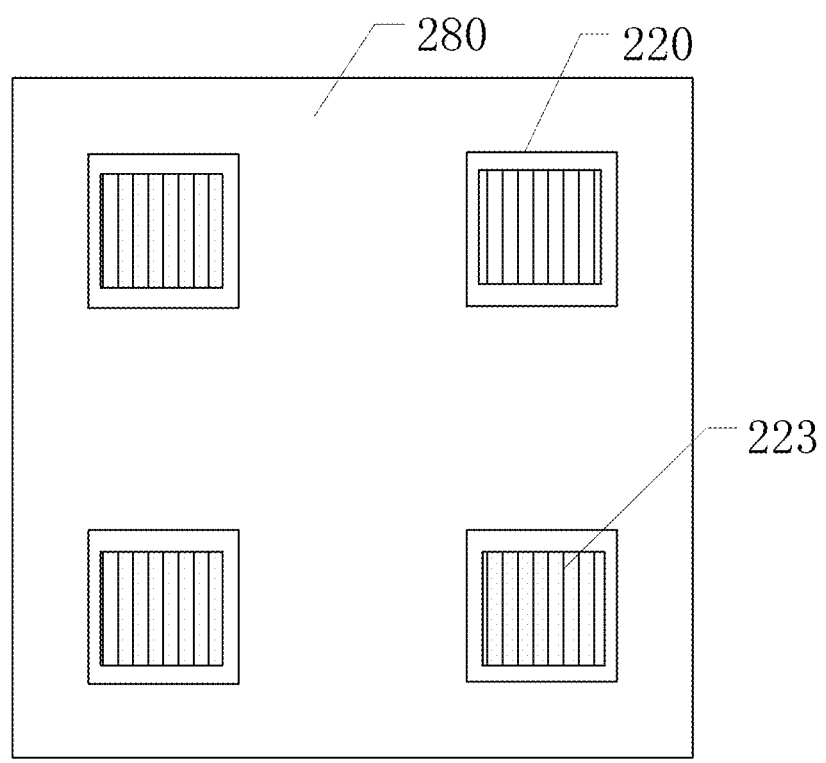
FIG. 14 is a schematic diagram of a fingerprint identification module provided by an embodiment of the present disclosure.

An embodiment of the present disclosure provides a fingerprint identification module. FIG. 14 is a schematic diagram of a fingerprint identification module provided by an embodiment of the present disclosure. As illustrated by FIG. 14, the fingerprint identification module includes a base substrate 280, a plurality ultrasonic wave devices 220 are disposed in an array and provided on a side of the base substrate 280. Each of the ultrasonic wave devices 220 includes a third piezoelectric material layer 223. A material of the third piezoelectric material layer 223 includes an aluminum nitride or a lead zirconate titanate piezoelectric ceramic. The fingerprint identification module utilizes the ultrasonic wave devices 220 to realize fingerprint identification. Because the ultrasonic wave devices of the aluminum nitride or the lead zirconate titanate piezoelectric ceramic can have a high ultrasonic transmitting efficiency, the number of ultrasonic wave sensors configured for fingerprint identification can be reduced under the same electric driving conditions.

An embodiment of the present disclosure further provides a driving method of a fingerprint identification module for driving the fingerprint identification module shown in FIG. 14. The driving method includes that a part of the ultrasonic wave devices is driven to transmit an ultrasonic wave, and at least part of the ultrasonic wave devices is driven to receive an ultrasonic wave reflected by a fingerprint.

For example, in some examples, the ultrasonic wave devices includes a first ultrasonic wave device and a second ultrasonic wave device. Driving a part of the ultrasonic wave devices to transmit an ultrasonic wave includes that the first ultrasonic wave device is driven to transmit an ultrasonic wave at a first time point; and the second ultrasonic wave device is driven to transmit an ultrasonic wave at a second time point, so that a phase of the ultrasonic wave transmitted by the second ultrasonic wave device is delayed with respect to a phase of the ultrasonic wave transmitted by the first ultrasonic wave device. The second time point is later than the first time point. Of course, the embodiments of the present disclosure include, but not limited thereto. It should be noted that two or more ultrasonic wave sensors can be used as a group of ultrasonic wave transmitting sensor groups. Focusing can be performed in each of the ultrasonic wave transmitting sensor groups in accordance with a delay driving method. However, different ultrasonic wave transmitting sensor groups have no influence on each other, and can be driven at the same time or driven by a scanning driving, thereby reducing an identification time of entire fingerprint identification module.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments of the present disclosure can be combined.

The above are only specific implementations of the present disclosure, and the protection scope of the present disclosure is not limited thereto. Any modifications or substitutions easily occur to those skilled in the art within the technical scope of the present disclosure should be fallen within the protection scope of the present disclosure. Therefore, the protection scope of the present disclosure should be based on the protection scope of the claims.

What is claimed is:

1. A fingerprint identification module, comprising:
a plurality of ultrasonic wave receiving sensors, configured to receive an ultrasonic wave; and
at least one ultrasonic wave transmitting sensor, configured to transmit an ultrasonic wave,
wherein each of the plurality of ultrasonic wave receiving sensors comprises a first piezoelectric material layer, each of the at least one ultrasonic wave transmitting sensor comprises a second piezoelectric material layer, and a material of the first piezoelectric material layer is different from a material of the second piezoelectric material layer,
each of the plurality of ultrasonic wave receiving sensors further comprises a first receiving electrode and a second receiving electrode, the first receiving electrode is located on a side of the first piezoelectric material layer, the second receiving electrode is located on a side of the first piezoelectric material layer away from the first receiving electrode, and
each of the at least one ultrasonic wave transmitting sensor further comprises a first transmitting electrode and a second transmitting electrode, the first transmitting electrode is located on a side of the second piezoelectric material layer, the second transmitting electrode is located on a side of the second piezoelectric material layer away from the first transmitting electrode, the fingerprint identification module further comprises a base substrate, located on a side of the first receiving electrode away from the first piezoelectric material layer, and comprising a contact surface configured to be contacted by a fingerprint; a first contact electrode; and a second contact electrode, wherein the first transmitting electrode is locate on a side of the second receiving electrode away from the base substrate, the first contact electrode and the second contact electrode are provided in a same layer with the second receiving electrode, each of the at least one ultrasonic wave transmitting sensor further comprises a via hole and a connection electrode that are located in the second, piezoelectric material layer, the first contact electrode is directly in contact with the first transmitting electrode, the connection electrode passes through the via hole to electrically connect the second transmitting electrode and the second contact electrode.

2. The fingerprint identification module according to claim 1, wherein the second piezoelectric material layer has a piezoelectric strain constant greater than that of the first piezoelectric material layer.

3. The fingerprint identification module according to claim 2, wherein the first piezoelectric material layer has a piezoelectric voltage constant greater than that of the second piezoelectric material layer.

4. The fingerprint identification module according to claim 2, wherein a material of the first piezoelectric material layer comprises a polyvinylidene fluoride, and a material of the second piezoelectric material layer comprises an aluminum nitride or a lead zirconate titanate piezoelectric ceramic.

5. The fingerprint identification module according to claim 1, wherein the first transmitting electrode and the first receiving electrode are provided in a same layer, the second transmitting electrode and the second receiving electrode are provided in a same layer.

6. The fingerprint identification module according to claim 1, wherein each of the at least one ultrasonic wave transmitting sensor further comprises:
a cavity, located on a side of the second transmitting electrode away from the second piezoelectric material layer.

7. The fingerprint identification module according to claim 1, wherein a thickness of the second receiving electrode is less than 10 microns.

8. A display device, comprising:
the fingerprint identification module according to claim 1; and
a display module,
wherein an area of the display module is the same as an area of the fingerprint identification module.

9. A manufacturing method of a fingerprint identification module, comprising:
providing a base substrate;
forming a plurality of ultrasonic wave receiving sensors on a side of the base substrate; and
forming at least one ultrasonic wave transmitting sensor on a side of the base substrate where the plurality of the ultrasonic wave receiving sensors are formed,
wherein each of the plurality of ultrasonic wave receiving sensors comprises a first piezoelectric material layer, each of the at least one ultrasonic wave transmitting sensors comprises a second piezoelectric material layer, and a material of the first piezoelectric material layer is different from a material of the second piezoelectric material layer, forming the at least one ultrasonic wave transmitting sensor on the side of the base substrate where the plurality of the ultrasonic wave receiving sensors are formed comprises: providing the at least one ultrasonic wave transmitting sensor; and transferring the at least one ultrasonic wave transmitting sensor on a side of the ultrasonic wave receiving sensors away from the base substrate by a transfer process, forming the plurality of ultrasonic wave receiving sensors on the side of the base substrate comprises: forming a plurality of first receiving electrodes on the side of the base substrate; forming a first piezoelectric material layer on a side of the plurality of the first receiving, electrodes away from the base substrate; and forming a plurality of second receiving electrodes in one-to-one correspondence with the plurality of the first receiving electrodes on a side of the first piezoelectric material layer, the plurality of the first receiving electrodes and the plurality of the second receiving electrodes that are in one-to-one correspondence and the first piezoelectric material layer constitute the plurality of the ultrasonic wave receiving sensors, wherein forming a first contact electrode and a second contact electrode which are provided in a same layer with the plurality of the second receiving electrodes while forming the plurality of the second receiving electrodes.

10. The manufacturing method of the fingerprint identification module according to claim 9, wherein the second piezoelectric material layer has a piezoelectric strain constant greater than that of the first piezoelectric material layer.

11. The manufacturing method of the fingerprint identification module according to claim 9, wherein each of the at least one ultrasonic wave transmitting sensor comprises a first transmitting electrode, a second piezoelectric material layer, a second transmitting electrode, and a via hole and a connection electrode that are located in the second piezoelectric material layer, transferring the at least one ultrasonic wave transmitting sensor on a side of the ultrasonic wave receiving sensors away from the base substrate by a transfer process comprises:
connecting the first transmitting electrode and the first contact electrode; and
connecting the connection electrode and the second contact electrode, wherein the connection electrode passes through the via hole to electrically connect the second transmitting electrode and the second contact electrode.

12. A driving method of a fingerprint identification module, wherein the fingerprint identification module comprises:
a plurality of ultrasonic wave receiving sensors configured to receive an ultrasonic wave; and
at least one ultrasonic wave transmitting sensor, configured to transmit an ultrasonic wave,
wherein each of the plurality of ultrasonic wave receiving sensors comprises a first piezoelectric material layer, each of the at least one ultrasonic wave transmitting sensor comprises a second piezoelectric material layer, and a material of the first piezoelectric material layer is different from a material of the second piezoelectric material layer,
each of the plurality of ultrasonic wave receiving sensors further comprises a first receiving electrode and second receiving electrode, the first receiving electrode is located on a side of the first piezoelectric material layer, the second receiving electrode is locate don a side of the first piezoelectric material layer away from the first receiving electrode, and each of the at least one ultrasonic wave transmitting sensor further comprises a first transmitting electrode and a second transmitting electrode, the first transmitting electrode is located on a side of the second piezoelectric material laver, the second transmitting electrode is located on aside of the second piezoelectric material layer away from the first transmitting electrode, the fingerprint identification module further comprises a base substrate, located on a side of the first receiving electrode away from the first piezoelectric material layer, and comprising a contact surface configured to be contacted by a fingerprint; a first contact electrode; and a second contact electrode, the first transmitting electrode is located on a side of the second receiving electrode away from the base substrate, the first contact electrode and the second contact electrode are provided in a same layer with the second receiving electrode, each of the at least one ultrasonic wave transmitting sensor further comprises a via hole and a connection electrode that are located in the second piezoelectric material layer, the first contact electrode is directly in contact with the first transmitting electrode, the connection electrode passes through the via hole to electrically connect the second transmitting electrode and the second contact electrode, wherein the driving method comprises:

driving the at least ultrasonic wave transmitting sensor to transmit an ultrasonic wave; and driving the plurality of ultrasonic wave receiving sensors to receive an ultrasonic wave reflected by a fingerprint.

13. The driving method of the fingerprint identification module according to claim 12, wherein the at least one ultrasonic wave transmitting sensor comprises a first ultrasonic wave transmitting sensor and a second ultrasonic wave transmitting sensor, the driving method comprises:

driving the first ultrasonic wave transmitting sensor to transmit an ultrasonic wave at a first time point; and driving the second ultrasonic wave transmitting sensor to transmit an ultrasonic wave at a second time point, so that a phase of the ultrasonic wave transmitted by the second ultrasonic wave transmitting sensor is delayed with respect to a phase of the ultrasonic wave transmitted by the first ultrasonic wave transmitting sensor, wherein the second time point is later than the first time point.

14. The driving method of the fingerprint identification module according to claim 13, wherein the at least one of the ultrasonic wave transmitting sensors comprises a third ultrasonic wave transmitting sensor, the second ultrasonic wave transmitting sensor is located between the first ultrasonic wave transmitting sensor and the third ultrasonic wave transmitting sensor, the driving method comprises:

driving the first ultrasonic wave transmitting sensor and the third ultrasonic wave transmitting sensor to transmit an ultrasonic wave at the first time point; and driving the second ultrasonic wave transmitting sensor to transmit an ultrasonic wave at a second time point, so that a phase of the ultrasonic wave transmitted by the second ultrasonic wave transmitting sensor is delayed with respect to a phase of the ultrasonic wave transmitted by the first ultrasonic wave transmitting sensor and the third ultrasonic wave transmitting sensor, wherein the second time point is later than the first time point.

\* \* \* \* \*